(12) United States Patent
Hasegawa et al.

(10) Patent No.: US 6,383,907 B1
(45) Date of Patent: May 7, 2002

(54) PROCESS FOR FABRICATING A SEMICONDUCTOR DEVICE

(75) Inventors: Toshiaki Hasegawa; Koichi Ikeda; Hideyuki Kito, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/655,832

(22) Filed: Sep. 6, 2000

(30) Foreign Application Priority Data

Sep. 8, 1999 (JP) ............................................ 11-253769

(51) Int. Cl.$^7$ ................................................ H01L 21/44
(52) U.S. Cl. ...................................... 438/597; 438/689
(58) Field of Search ................................ 438/597, 149, 438/694, 689

(56) References Cited

U.S. PATENT DOCUMENTS

| 5,567,550 A | * 10/1996 | Smayling | 430/5 |
| 5,795,802 A | * 8/1998 | Ko et al. | 438/227 |
| 5,976,977 A | * 11/1999 | Hong | 438/689 |
| 6,261,881 B1 | * 7/2001 | Yamazaki et al. | 438/161 |

* cited by examiner

Primary Examiner—David Nelms
Assistant Examiner—Thao Le
(74) Attorney, Agent, or Firm—Rader, Fishman & Grauer

(57) ABSTRACT

A process for producing a semiconductor device comprising an interlayer dielectric containing an organic film, which process comprises the step of forming on the interlayer dielectric a three-layer mask comprising a first mask, a second mask and a third mask in this order from the bottom, in which the first mask, the second mask and the third mask are made of materials different from one another, and the second mask is formed from a film made of a material which protects a film for forming the first mask during formation of the third mask. The process of the present invention is advantageous not only in that the second mask serves as a protecting film for the layers under the first mask during formation of the third mask, so that etching using a resist mask can be conducted during formation of the third mask, and further it becomes possible to perform a regeneration treatment for the resist mask while preventing the layers under the first mask from suffering a damage, but also in that, as a material for the first mask, the same material as that for the resist mask, for example, a carbon-containing material having a low dielectric constant can be used.

7 Claims, 3 Drawing Sheets

PROCESS FOR FABRICATING A SEMICONDUCTOR DEVICE

BACKGROUND OF THE INVENTION

1. Field of the Invention

The present invention relates to a process for producing a semiconductor device. More particularly, the present invention is concerned with a process for producing a semiconductor device suitable for a device process comprising a multilayer wiring under the 0.25-μm design rule or later design rules

2. Prior Art

The tendency of the scale down of semiconductor devices has increased the demand for very fine wiring and reduced wiring pitch. In addition, in accordance with the demand for low power consumption, high speed and the like, the development of interlayer dielectrics having low dielectric constant and wirings having low resistance are needed. Particularly, in logic devices, the increased resistance and the increased wiring capacitance due to very fine wirings cause the response rate of the devices to be lower. Therefore, fine multilayer wirings using low dielectric constant films as interlayer dielectrics are demanded.

The scale down of wiring width and the reduction of wiring pitch are achieved not only by increasing the aspect ratio of the wiring cross-section, but also by increasing the aspect ratio of the space between wirings. As a result, a technique for forming very fine slender-form wirings, a technique for implanting the spaces between fine wirings with interlayer dielectrics and the like must be used, thus leading to the disadvantages of the process becomes complicated and the number of steps in the process is increased.

For example, in a Damascene process in which connecting holes (e.g., via holes) and wiring trenches are simultaneously implanted with a metal (e.g., aluminum, copper or the like) by reflow sputtering and the excess metal is removed from the surface of the metal by chemical mechanical polishing (hereinafter, referred to simply as "CMP"), there is neither a need for forming metal wirings having a high aspect ratio by etching nor a need for implanting the narrow gaps between the wirings with interlayer dielectrics, thus making it possible to reduce considerably the number of steps in the process. The larger the aspect ratio of wiring, or the larger the total number of wirings, the more largely the Damascene process contributes to the reduction of the total production cost.

In the patterning techniques used in the conventional process for producing semiconductor devices, a resist film, which is an organic film, is used as a mask for etching. On the other hand, many of the low dielectric constant films having a dielectric constant of less than 3.0 are films containing carbon, i.e., the so-called organic films, and when such films are used as interlayer dielectrics, it is necessary to use oxygen gas as an etching gas for forming via holes in the interlayer dielectrics. For this reason, problems arise in that the resist film suffers damage and, in some cases, the resist film disappears during etching. Further, when the resist film is removed, there is a possibility that the low dielectric constant film is removed disadvantageously together with the resist film because the composition of the low dielectric constant film is close to that of the resist film. Therefore, it is difficult to perform the so-called regeneration treatment for the resist film.

SUMMARY OF THE INVENTION

In this situation, the present inventors have made extensive and intensive studies with a view toward solving the above-mentioned problems accompanying the prior art. As a result, it has been found unexpectedly that, by the process for producing a semiconductor device, which comprises the step of forming on an interlayer dielectric, a three-layer mask comprising a first mask, a second mask and a third mask in this order from the bottom, in which the first mask, the second mask and the third mask are made of materials different from one another, and the second mask is formed from a film made of a material which protects the film for forming the first mask during formation of the third mask, not only does the second mask serve as a protecting film for the ground under the first mask during formation of the third mask, so that etching using a resist mask can be conducted during formation of the third mask, and further it becomes possible to perform a regeneration treatment for the resist mask while preventing the ground under the first mask from suffering a damage, but also in that, as a material for the first mask, the same material as that for the resist mask, for example, a carbon-containing material having a low dielectric constant, can be used. The present invention has been completed, based on the above novel finding.

Accordingly, it is a primary object of the present invention to provide a process for producing a semiconductor device comprising an interlayer dielectric containing an organic film, which is advantageous not only in that etching using a resist mask can be conducted during formation of the third mask, and further it becomes possible to perform a regeneration treatment for the resist mask while preventing the ground under the first mask from suffering a damage, but also in that, as a material for the first mask, the same material as that for the resist mask can be used.

The foregoing and other objects, features and advantages of the present invention will be apparent to those skilled in the art from the following detailed description taken in connection with the accompanying drawings and the appended claims.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:.

DETAILED DESCRIPTION OF THE PREFERRED EMBODIMENTS

Hereinbelow, one preferred embodiment of the process for producing a semiconductor device according to the present invention will be described in detail with reference to FIGS. 1A to 1F, but the embodiment should not be construed as limiting the scope of the present invention.

Figure 1A:
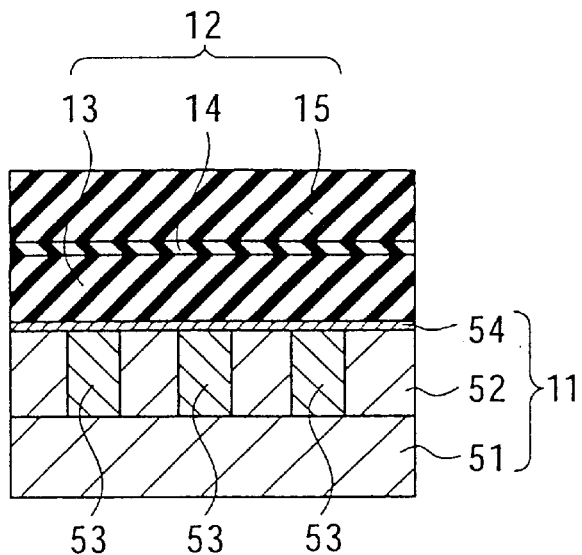
FIGS. 1A to 1F are diagrammatic cross-sectional views of one form of the steps in a process for producing a semiconductor device according to one embodiment of the present invention.

As shown in FIG. 1A, a substrate 11 comprises, for example, a base material 51 having formed thereon a semiconductor device (not shown), such as a transistor or the like, and an interlayer dielectric 52 covering these and having formed therein a wiring 53. In addition, on the interlayer dielectric 52, a diffusion-preventing layer 54 is formed so as to cover the upper surface of the wiring 53. The diffusion-preventing layer 54 is formed from, for example, a silicon nitride film so as to have a thickness of 50 to 100 nm.

Further, on the diffusion preventing layer 54, a first low dielectric constant film 13, which constitutes the lower layer portion of an interlayer dielectric 12, is formed so as to have a thickness of, for example, 300 to 800 nm. The first low dielectric constant film 13 serves as an inter level dielectric (ILD) between wiring layers in which via holes for connecting the wiring layers to one another are formed and can be formed from an organic film having a dielectric constant of about 2.5. In this embodiment, as an example of such an organic film, an organic polymer generally called polyaryl ether is used. Examples of polyaryl ethers include FLARE (trade name; manufactured and sold by AlliedSignal, Inc., U.S.A.), SiLK (trade name; manufactured and sold by Dow Chemical Company, U.S.A.), VELOX (trade name; manufactured and sold by Schumacher Co., U.S.A.) and the like. In addition, as the first low dielectric constant film 13, a benzocyclobutene (BCB) film, a polyimide film, an amorphous carbon film, a fluororesin film, a cyclic fluororesin film, Teflon® (polytetrafluoroethylene; PTFE), amorphous Teflon® (e.g., Teflon AF; manufactured and sold by Du Pont Co., U.S.A.), a fluorinated aryl ether, a fluorinated polyimide or the like also can be used.

The above polyaryl ether has a feature such that it can be easily dry-etched using nitrogen ($N_2$) gas, hydrogen ($H_2$) gas or ammonia ($NH_3$) gas as the etching gas.

The above organic polymer is deposited by applying a precursor on the substrate 11 by, for example, spin coating, and then curing the precursor at 300 to 450° C. When the surface of the substrate 11 is hydrophobic and thus has a poor adherence to the organic polymer film, a not shown silicon oxide film, silicon nitride oxide film, silicon carbide film or silicon nitride film is deposited on the substrate 11. Further, when it is intended to prevent copper from diffusing, a not shown silicon carbide film or silicon nitride film is deposited.

The above-mentioned silicon oxide film is deposited by applying a commercially available inorganic spin on glass (SOG), comprised mainly of silanol or a polymer containing silanol, using, for example, a spin coating method so that the thickness thereof becomes, for example, 30 to 100 nm. Then, after the spin coating, baking is performed at 150 to 200° C. for about 1 minute, followed by curing at 350 to 450° C. for about 30 minutes to about 1 hour.

The above-mentioned silicon oxide film may be deposited by a plasma chemical vapor deposition (CVD) process using a commercially available plasma CVD machine. However, when the wiring 53 is formed from copper wiring, the deposition of a silicon oxide film using a typical plasma CVD process is not preferred because the plasma CVD causes the copper wiring to undergo oxidization. In such a case, it is possible to suppress the oxidization of the copper wiring as low as possible by depositing the silicon oxide film under conditions such that dinitrogen monoxide ($N_2O$) gas is used as an oxidant, a silane e.g., monosilane ($SiH_4$), disilane ($Si_2H_6$), or trisilane ($Si_3H_8$)) gas is used as a silicon source, the substrate temperature is 300 to 400° C., the plasma power is 350 W, and the pressure of the atmosphere for deposition is about 1 kPa.

On the other hand, the silicon nitride oxide film may be deposited by applying a commercially available inorganic SOG having an amino group using, for example, a spin coating method. It is preferred that the deposition is conducted using a plasma CVD process. The gases to be used and their purposes are, for example: the above-described silane gas is used as a silicon source; ammonia, hydrazine or the like is used as a nitriding agent; dinitrogen monoxide ($N_2O$) gas is used as an oxidant; and an inert gas, such as nitrogen gas, helium gas, argon gas or the like, is used as a carrier gas. In addition, the conditions for deposition are, for example, such that the substrate temperature is 300 to 400° C., the plasma power is 350 W, and the pressure of the atmosphere for deposition is about 1 kPa.

The above-mentioned silicon nitride film may be deposited by applying a commercially available inorganic SOG having an amino group using a spin coating method in the same manner as in the case of the above silicon nitride oxide film. It is preferred that the deposition is conducted using a plasma CVD process. The gases to be used and their purposes are, for example: the above-described silane gas is used as a silicon source; ammonia, hydrazine or the like is used as a nitriding agent; dinitrogen monoxide ($N_2O$) gas is used as an oxidant; and an inert gas, such as nitrogen gas, helium gas, argon gas or the like, is used as a carrier gas. In addition, conditions for deposition are, for example, such that the substrate temperature is 300 to 400° C., the plasma power is 350 W, and the pressure of the atmosphere for deposition is about 1 kPa.

In the deposition of the above-mentioned silicon carbide film, for example, a parallel plate plasma CVD machine is used, and gases for example, methylsilane gas, are used as a silicon source. In addition, conditions for deposition are, for example, such that the substrate temperature is 300 to 400° C., the plasma power is 150 to 350 W, and the pressure of the atmosphere for deposition is about 100 Pa to about 1 kPa.

Next, on the first low dielectric constant film 13, a silica film is deposited as an intermediate layer 14. As the silica film, for example, a SOG can be used.

Examples of such SOG's include those which are generally referred to as methyl silsesquioxane (MSQ). The MSQ film is a film having a Si—O linkage, a Si—H linkage and a Si—$CH_x$ linkage (wherein x represents 1, 2 or 3), and is deposited by, for example, a coating method. Further, the MSQ film may be deposited by a CVD process or sputtering.

For example, the film deposited by a CVD process is called SiOC and is frequently deposited by plasma CVD using a raw material gas mixture comprising $Si(CH_3)_xH_y$ (wherein x represents 1, 2 or 3, and y represents 3, 2 or 1) and oxygen ($O_2$) in a ratio of about 1:1 to about 1:5 or a raw material gas mixture comprising $Si(CH_3)_xH_y$ (wherein x represents 1, 2 or 3, and y represents 3, 2 or 1) and dinitrogen monoxide ($N_2O$) in a ratio of about 1:5 to about 1:10. For example, when trimethylsilane [$Si(CH_3)_3H$] is used, a plasma enhanced CVD process is employed and conditions for deposition are, for example, such that nitrogen ($N_2$) gas or a rare gas is used as a carrier gas, the flow rate of the carrier gas fed is about 1,000 sccm, the flow rate of the raw material gas mixture fed is about 15 to 30 sccm, the substrate temperature is 200 to 400° C., the pressure of the atmosphere for deposition is 26.7 Pa, and the plasma power is 350 W.

Further, examples of the SOG's also include those which are generally referred to as hydrogen methyl silsesquioxane (HMSQ). The HMSQ film is a film having an Si—H linkage, a Si—O linkage and a Si—$CH_x$ linkage (wherein x represents 1, 2 or 3)and is generally deposited by a coating method. It is desired that the HMSQ film be deposited so as to have a thickness of 20 to 100 nm. When the thickness of the HMSQ film deposited is less than 20 nm, the HMSQ film does not function as an etching stopper, and, on the other hand, when the thickness is more than 100 nm, the capacitance between wirings is increased disadvantageously and markedly.

Further, examples of the SOG's also include those which are generally referred to as hydrogen silsesquioxane (HSQ). The HSQ film is a film having a Si—H linkage and a Si—O linkage and has a dielectric constant of about 2.6 to about 3.0, which dielectric constant is determined by the residual ratio of hydrogen atoms (H). The HSQ film is generally deposited by a coating method. It is desired that the HSQ film be deposited so as to have a thickness of 20 to 100 nm. When the thickness of the HSQ film deposited is less than 20 nm, the HSQ film does not function as an etching stopper, and, on the other hand, when the thickness is more than 100 nm, the capacitance between wirings is increased disadvantageously and markedly.

Furthermore, a polymer obtained by polymerizing two or more compounds selected from MSQ, HMSQ, HSQ, silanol and the like in an appropriate ratio can also be deposited by a coating method. It is desired that such a polymer film be deposited so as to have a thickness of 20 to 100 nm. When the thickness of the film deposited is less than 20 nm, the film does not function as an etching stopper, and, on the other hand, when the thickness is more than 100 nm, the capacitance between wirings is increased disadvantageously and markedly.

In any of the above-described deposition processes, after deposition, generally, the solvent is evaporated by prebaking at 150 to 250° C. for 60 to 120 seconds, and then a heat treatment is performed such that the Si—OH reaction is advanced by post-baking at 350 to 400° C. in an inert atmosphere or in a reduced pressure atmosphere at 133 Pa or less for 1 hour.

As another deposition method, there can be mentioned a low temperature CVD process. In this CVD process, for example, a raw material gas mixture comprising hydrogen peroxide ($H_2O_2$), monosilane ($SiH_4$) and trimethylsilane [$Si(CH_3)_3H$] is used, the substrate temperature is set at 0 to 20° C., and the pressure of the atmosphere for deposition is set at 133 Pa to 1.33 kPa. Also in this case, after deposition, a prebaking is conducted at 150 to 200° C. for 60 to 120 seconds to allow $H_2O$ to be evaporated. Further, a heat treatment is performed such that the Si—OH reaction is advanced by post-baking at 350 to 400° C. in an inert atmosphere or in a reduced pressure atmosphere at 133 Pa or less for 1 hour.

Then, on the intermediate layer 14, a second low dielectric constant film 15, which constitutes the upper layer portion of the interlayer dielectric 12, is formed so as to have a thickness of, for example, 400 nm. The second low dielectric constant film 15 serves as an inter-metal dielectric (IMD) between wirings, in which a wiring is formed, and can be formed from an organic film having a dielectric constant of about 2.5. In this embodiment, as an example of such an organic film, an organic polymer generally called polyaryl ether is used. Examples of polyaryl ethers include FLARE (trade name; manufactured and sold by AlliedSignal, Inc., U.S.A.), SiLK (trade name, manufactured and sold by Dow Chemical Company, U.S.A.), VELOX (trade name; manufactured and sold by Schumacher Co., U.S.A.) and the like. In addition, as the second low dielectric constant film 15, a BCB film, a polyimide film, an amorphous carbon film, a fluororesin film, a cyclic fluororesin film, Teflon® (PTFE), amorphous Teflon® (e.g., Teflon AF, manufactured and sold by Du Pont Co., U.S.A.), a fluorinated aryl ether, and a fluorinated polyimide or the like also can be used.

The above polyaryl ether has a feature such that it can be easily dry-etched using nitrogen ($N_2$) gas, hydrogen ($H_2$) gas or ammonia ($NH_3$) gas as an etching gas.

The second low dielectric constant film 15 is deposited by applying a precursor on the intermediate layer 14 by a spin coating machine and then curing the precursor at 300 to 450° C. Materials, such as fluorinated amorphous carbon and the like, can be deposited by a plasma CVD process using acetylene ($C_2H_2$) gas or a fluorocarbon gas (representative example of which is octafluorobutene ($C_4F_8$)) as a process gas. Also in this case, after deposition, curing is conducted at 300 to 450° C. The above amorphous Teflon is not limited to Teflon AF as long as it has a structure represented by the following formula (1):

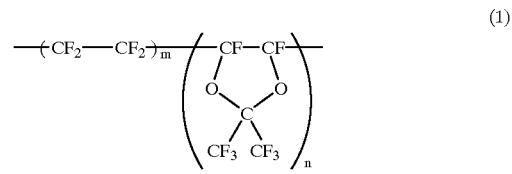

(wherein each of $m$ and $n$ represents a positive integer)

wherein each of m and n represents a positive integer.

As the second low dielectric constant film 15, a cyclopolymerized florinated polymer resin (e.g., Cytop (trade name; manufactured and sold by Asahi Glass Co., Ltd., Japan)) also can be used. The cyclopolymerized florinated polymer resin is not limited to the above Cytop as long as it has a structure represented by the following formula (2):

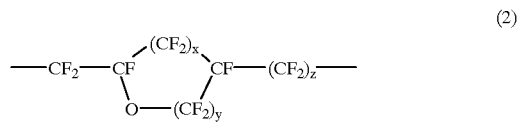

(wherein each of $x$, $y$ and $z$ represents a positive integer)

wherein each of x, y and z represents a positive integer.

As the second low dielectric constant film 15, a florinated polyaryl ether resin (e.g., FLARE (trade name) manufactured and sold by AlliedSignal, Inc., U.S.A.) also can be used. The florinated polyaryl ether resin is not limited to the above FLARE as long as it has a structure represented by the following formula (3):

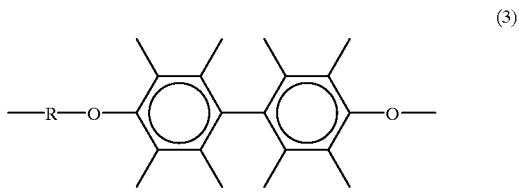

(wherein R represents an alkyl group)

wherein R represents an alkyl group.

When the surface of each of the first low dielectric constant film 13, the intermediate layer 14, the second low dielectric constant film 15, the first film 16 and the like is hydrophobic (for example, in a case where the contact angle of water is about 50 degrees or higher) and, thus, it is difficult to apply the organic film onto the surface, it is desired that the level of the hydrophobicity of the surface is lowered by a plasma treatment using an inert gas, such as argon (Ar) gas or the like, or ultraviolet-light irradiation (substrate temperature: 200 to 300° C). Generally, it is preferred that the surface has a contact angle of water of 50 degrees or less.

Thus, the interlayer dielectric 12 comprising the first low dielectric constant film 13, intermediate layer 14 and the second low dielectric constant film 15 is formed on the substrate 11.

Figure 1B:
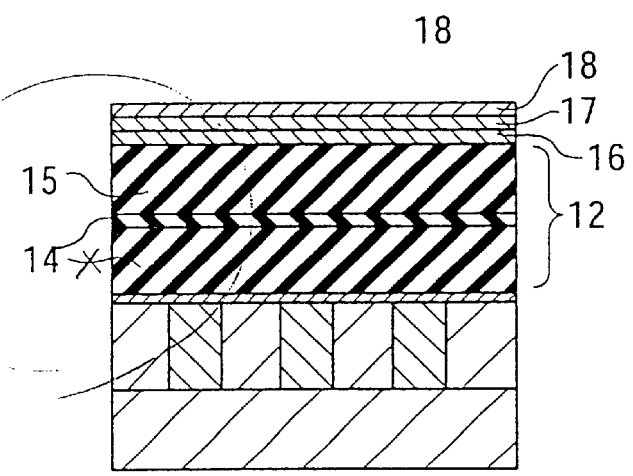

Next, as shown in FIG. 1B, on the interlayer dielectric 12, namely, on the second low dielectric constant film 15, as an inorganic mask, the first film 16 for forming a first mask is formed from the same material as that for the intermediate layer 14 so as to have a thickness of, for example, 50 to 100 nm. In this embodiment, as an example, the first film 16 is formed from an organic SOG film.

Subsequently, a second film 17 for forming a second mask is formed from a silicon oxide film so as to have a thickness of, for example, 50 to 300 nm.

Then, a third film 18 for forming a third mask was formed from a silicon nitride film so as to have a thickness of, for example, 50 to 150 nm.

The deposition of each of the above silicon oxide film and silicon nitride film is conducted using a general CVD machine under the same conditions as described above. In addition, before forming the silicon oxide film, if desired, especially when there is a problem of the oxidization of the second low dielectric constant film 15, it is preferred to deposit a silicon nitride film, an amorphous silicon film, a silicon nitride oxide film, or a silicon oxide film containing silicon in an amount larger than the stoichiometric amount. Specifically, a film is deposited by CVD in a reducing atmosphere. It is preferred that the film thickness be as small as possible and is deposited so as to have a thickness of about 10 nm.

As mentioned above, the first film 16 is formed from an organic SOG film having excellent light transmission properties in the wavelength range used in the alignment (e.g., 200 to 1,000 nm), the second film 17 is formed from a silicon oxide film having excellent light transmission properties in the wavelength range used in the alignment (e.g., 200 to 1,000 nm), and the third film 18 is formed from a silicon nitride film having excellent light transmission properties in the wavelength range used in the alignment (e.g., 200 to 1,000 nm).

Figure 1C:
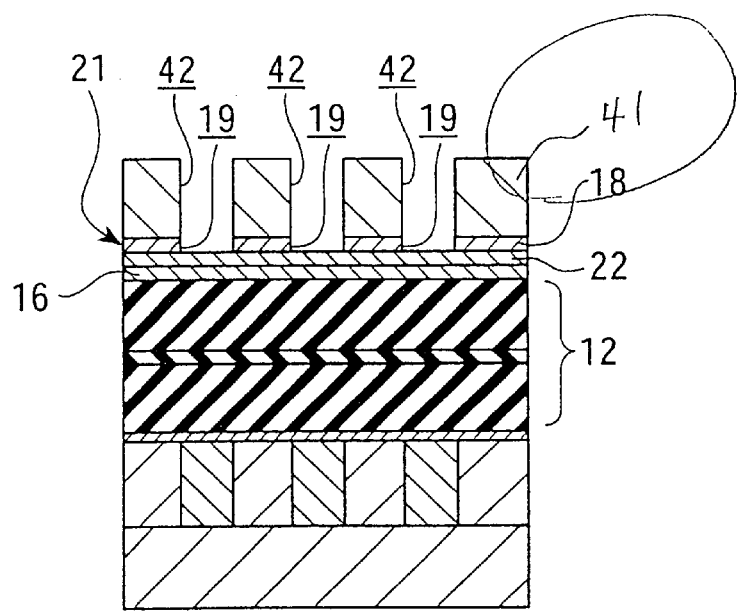

Next, as shown in FIG. 1C, on the third film 18, a first resist film 41 is deposited using a general resist coating technique (for example, spin coating method). Then, the first resist film 41 is subjected to patterning by a lithography technique, so that an opening portion 42 for forming a wiring trench is formed.

Subsequently, using the first resist film 41 as an etching mask, only the third film 18 is etched to form an opening portion 19 for forming a wiring trench, so that a third mask 21, which serves as an etching mask when forming a wiring trench in the interlayer dielectric 12, is formed. In this etching, only the third film 18 is selectively etched using, for example, a magnetron etching machine. When the third film 18 is formed from a silicon nitride film, conditions for etching are, for example, such that a mixed gas of trifluoromethane ($CHF_3$) gas (5 sccm), oxygen ($O_2$) gas (5 sccm) and argon (Ar) gas (20 sccm) is used as an etching gas, and the radio frequency (RF) plasma is 600 W. Then, the first resist film 41 is removed by ashing. In this instance, the second film 17 formed from a silicon oxide film functions as a second mask 22 and, thus, the first film 16 formed from an organic SOG film is protected by the second mask 22, so that the first film 16 suffers no damage. It is noted that FIG. 1C shows the state before the first resist film 41 is removed.

Figure 1D:
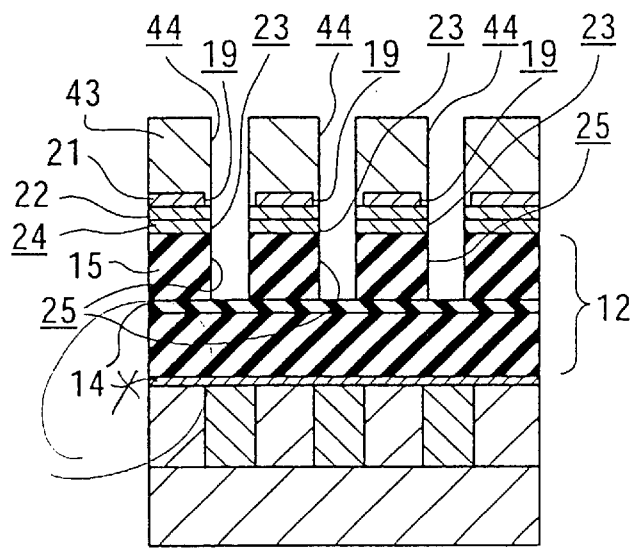

Then, as shown in FIG. 1D, on the third mask 21 and the second mask 22, the second resist film 43 is deposited using a general resist coating technique (for example, spin coating method). Then, the second resist film 43 is subjected to patterning by a lithography technique, so that an opening portion 44 for forming a via hole is formed so that a whole of or at least a part of the opening portion 44 is within the opening portion 19 for forming the above-mentioned wiring trench as viewed in the plane direction of the third mask 21.

Subsequently, using the second resist film 43 as an etching mask, the second mask 22 and the first film 16 are etched to form an opening portion 23 for forming a via hole in the second low dielectric constant film 15, so that the second mask 22 and the first mask 24, which serve as an etching mask when forming a via hole in the interlayer dielectric 12, are formed from the first film 16.

Then, using the second resist film 43, the second mask 22 and the first mask 24 as an etching mask, the second low dielectric constant film 15 in the interlayer dielectric 12 is etched using a general etching machine to form an opening portion 25. In this etching, for example, nitrogen ($N_2$) gas is used as an etching gas and, if desired, ammonia ($NH_3$) or hydrogen ($H_2$) is added thereto. It should be noted that the above etching gas contains no oxygen which causes the organic film to suffer damage. In addition, the above etching gas does not necessarily contain a fluorocarbon gas or carbon monoxide gas. Since the intermediate layer 14 formed from an organic SOG film is positioned under the second low dielectric constant film 15, the etching is stopped by the intermediate layer 14. In this instance, the second resist film 43 is completely removed by etching when the second low dielectric constant film 15 formed from an organic film is etched. Therefore, in this case, there is no need to perform a resist ashing.

Figure 1E:
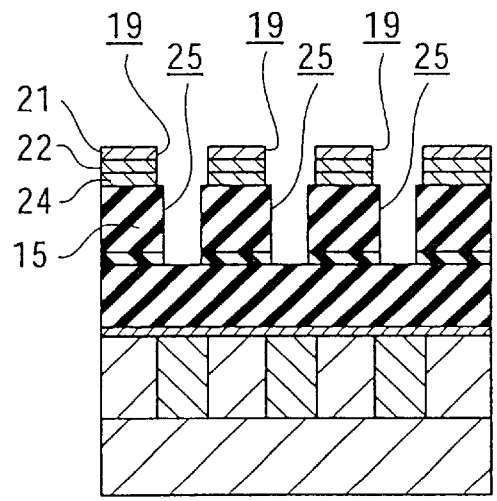

Further, as shown in FIG. 1E, using the third mask 21 formed from a silicon nitride film as an etching mask, the second mask 22 formed from a silicon oxide film and the first mask 24 formed from an organic SOG film are etched to form in the second mask 22 and the first mask 24 the opening portion 19 for forming a wiring trench, which is also formed in the third mask 21. Conditions for this etching are, for example, such that a mixed gas of octafluorobutene ($C_4F_8$) gas (5 sccm), carbon monoxide (CO) gas (5 sccm) and argon (Ar) gas (20 sccm) is used as an etching gas and the RF plasma is 600 W. Further, using the second low dielectric constant film 15 as an etching mask, the intermediate layer 14 exposed to the opening portion 25 is etched, so that the opening portion 25 is formed so as to be extended in the intermediate layer 14. In this instance, the third mask 21 is also etched, and the third mask 21 may be completely removed. FIG. 1E shows a case where the third mask 21 remains.

Figure 1F:
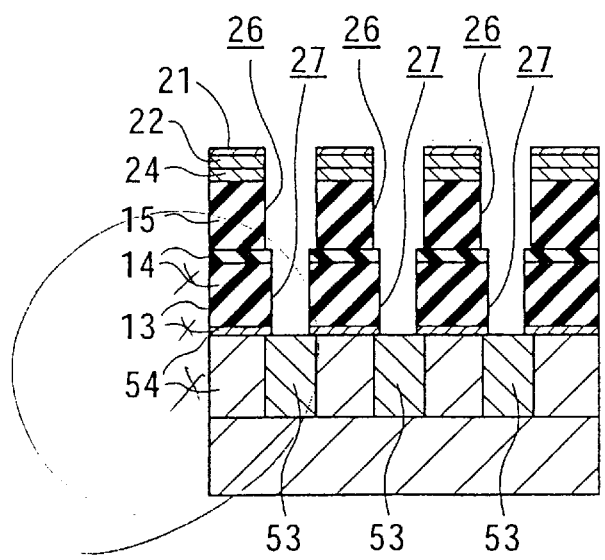

Next, as shown in FIG. 1F, using the third mask 21, the second mask 22 and the first mask 24 as an etching mask, the second low dielectric constant film 15 is etched using a general etching machine to form a wiring trench 26 while etching the first low dielectric constant film 13 using the intermediate layer 14 as an etching mask to form a via hole 27. In this etching, nitrogen gas is used as an etching gas; and, if desired, ammonia gas or hydrogen gas may be used.

Further, the diffusion-preventing layer 54 in the via hole 27 is etched, thereby to allow the upper surface of the wiring 53 to be exposed. In this etching, the third mask 21 also is etched; and the third mask 21 may be completely removed by etching depending on the thickness of the diffusion-preventing layer 54. FIG. 1F shows a case where the third mask 21 remains. In this etching, by introducing a large amount of fluorine radicals into the etching gas, it becomes possible to selectively etch the silicon nitride film for the silicon oxide film.

Figure 2A:
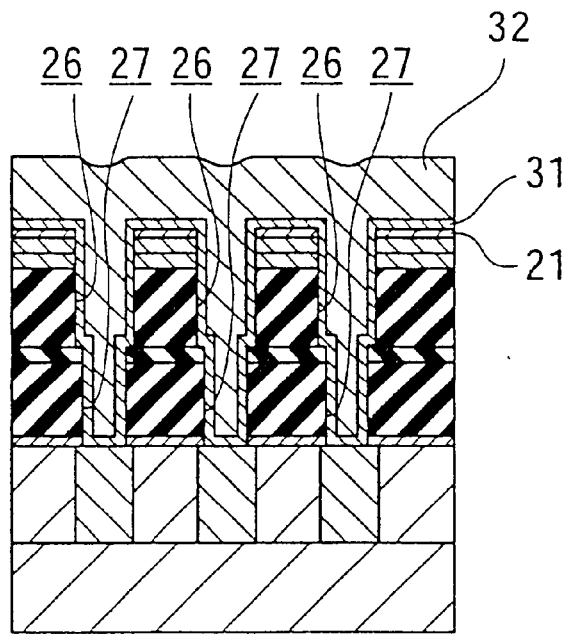
FIGS. 2A and 2B are diagrammatic cross-sectional views of one form of the steps in a process for producing a semiconductor device according to one embodiment of the present invention.

Then, as shown in FIG. 2A, a wiring is formed by a Damascene process. A barrier metal layer 31 formed from tantalum nitride or the like is first deposited on the inner wall of each of the wiring trench 26 and the via hole 27 by sputtering or a CVD process. In this instance, the barrier metal layer 31 is also deposited on the third mask 21. Then, a metal wiring material, for example, copper is deposited by sputtering, a CVD process or an electroplating process. When a metal 32 is deposited by the electroplating process, a seed layer (not shown) is previously formed from the same metal as that used as the metal 32 to be deposited.

Figure 2B:
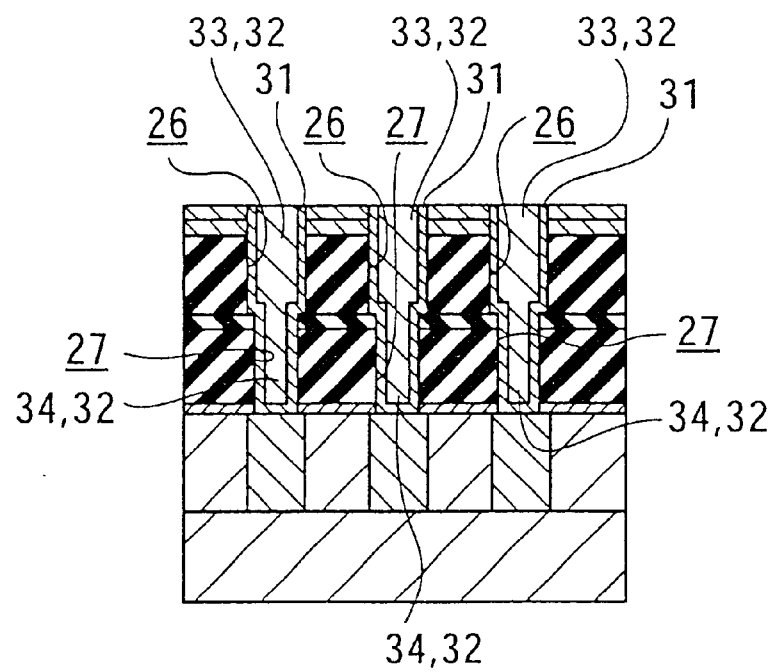

Subsequently, the excess metal 32 and the barrier metal layer 31 on the third mask 21 are removed by CMP, as shown in FIG. 2B, the wiring 33 comprising the metal 32 is formed in the wiring trench 26 through the barrier metal layer 31, and a plug 34 comprising the metal 32 is formed in the via hole 27 through the barrier metal layer 31. In this instance, the third mask 21 serves as a stopper for polishing (see FIG. 2A), and the third mask 21 may be completely removed depending on the thickness of the third mask 21. FIG. 2B shows a case where the third mask 21 is removed. In this case, the second mask 22 serves as a stopper for polishing. In the above CMP, as an example, an alumina slurry was used.

Although a figure is omitted, it becomes possible to form a multilayer wiring by repeating the sequence of the above-mentioned operations from the step of forming the interlayer dielectric 12 to the step of forming the wiring 33 and the plug 34.

Hereinabove, an explanation is given of an example of a production process in which the interlayer dielectric 12 is formed on the substrate 11 having formed thereon a semiconductor device, and also of when the interlayer dielectric 12, the wiring trench 26, the via hole 27, the wiring 33, the plug 34 and the like which have the above-described construction are formed on a substrate having thereon no semiconductor device.

Each of the diffusion-preventing layer 54 and the third film 18, which are formed from a silicon nitride film, also can be formed from an SiCH film, which is a kind of a silicon carbide film e.g., BLOK (trade name), manufactured and sold by Applied Materials, Inc., U.S.A.).

In the process for producing a semiconductor device of the above-mentioned embodiment of the present invention, which comprises the step of forming on the interlayer dielectric 12, a three-layer mask comprising the first mask 24, the second mask 22 and the third mask 21 in this order from the bottom, in which the first mask 24, the second mask 22 and the third mask 21 are made of materials different from one another, and the second mask 22 is formed, as the second film 17, from a film made of a material which protects the first film 16 during formation of the third mask 21, and the second mask 22 serves as a protecting film for the layers under the first film 16 during formation of the third mask 21. For this reason, etching using the first resist film 41 as a mask can be performed during formation of the third mask 21 and, further, it becomes possible to perform a regeneration treatment for the resist film 41 while preventing the layers under the first film 16 from suffering a damage. Further, it becomes possible to use, as a material for the first film 16, the same material as that for the resist, for example, the above-mentioned materials, such as MSQ and the like.

In addition, the resist process used in the fabrication of the first mask 24 can be conducted in a state such that the first film 16 for forming the interlayer dielectric 12 and the first mask 24 is covered with the second film 17 for forming the second mask 22. That is, in the resist process used in the formation of the first mask 24, it becomes possible to perform a regeneration treatment for the resist film 43 used in the process.

Further, by forming each of the first mask 24, the second mask 22 and the third mask 21 from a material having light transmission properties, it becomes possible to align the position of the mask to the substrate during exposure, namely, achieve the so-called mask alignment by employing the alignment using an ordinary light or an image processing.

Further, by forming the first mask 24 from, for example, MSQ, HMSQ or the like as a silica film having a Si—O linkage, a Si—H linkage and a Si—CH$_x$ linkage (wherein x represents 1, 2 or 3), or from HSQ or the like as a silica film having a Si—O linkage and a Si—H linkage, it is possible to form the first mask 24 which remains to the last as a film having a dielectric constant (e.g., about 2.8) lower than that of a typical silicon oxide film. Therefore, the capacitance between wiring layers is lowered, as compared to that of the prior art.

Furthermore, by forming the intermediate layer 14 between the first low dielectric constant film 13, which serves as an interlayer dielectric between wiring layers, and the second low dielectric constant film 15, which serves as an interlayer dielectric between wirings, from a silica film having a Si—O linkage, a Si—H linkage and a Si—CH$_x$ linkage (wherein x represents 1, 2 or 3), or from a silica film having a Si—O linkage and a Si—H, it is possible to form the intermediate layer 14 as a film having a dielectric constant (e.g., about 2.8) lower than that of a typical silicon oxide film. Therefore, the capacitance between wiring layers and the capacitance between wirings are lowered, as compared to those of the prior art.

INDUSTRIAL APPLICABILITY

By the process for producing a semiconductor device of the present invention, not only does the second mask serve as a protecting film for the ground under the first mask during formation of the third mask, so that etching using a resist mask can be conducted during formation of the third mask, and further it becomes possible to perform a regeneration treatment for the resist mask while preventing the ground under the first mask from suffering a damage, but also in that, as a material for the first mask, the same material as that for the resist mask, for example, a carbon-containing material having a low dielectric constant (MSQ, etc.) can be used. The semiconductor device produced by the process of the present invention is used advantageously in the device process comprising a multilayer wiring under the 0.25-$\mu$m design rule or later design rules.

What is claimed is:

1. A process for fabricating a semiconductor device comprising an interlayer dielectric containing an organic film, said process comprising the step of:
   forming on said interlayer dielectric a three-layer mask comprising a first mask, a second mask and a third mask in this order from the bottom, wherein said first mask, said second mask and said third mask are made of materials different from one another, wherein said second mask is formed from a film made of a material which protects a film for forming said first mask during formation of said third mask.

2. The process according to claim 1, further comprising the steps of:

forming in said third mask a wiring trench pattern for forming a wiring trench in said interlayer dielectric; and forming in both of said first mask and said second mask a via hole pattern for forming a via hole in said interlayer dielectric so that at least a part of said via hole pattern is superposed on said wiring trench pattern.

3. The process according to claim 2, further comprising the steps of:

depositing a first film for forming said first mask on said interlayer dielectric, and then depositing a second film for forming said second mask on said first film, and depositing a third film for forming said third mask on said second film;

forming a wiring trench pattern for forming a wiring trench in said third film, thereby forming said third mask; and forming in both of said second mask and said first film a via hole pattern for forming a via hole so that at least a part of said via hole pattern is superposed on said wiring trench pattern, thereby forming said first mask.

4. The process according to claim 1, wherein each of said first mask, said second mask and said third mask is formed from a material having light transmission properties.

5. The process according to claim 1, wherein said first mask is formed from one of a silica film having an Si—O linkage, an Si—H linkage and an Si—CH$_x$ linkage wherein x represents 1, 2 or 3, and a silica film having an Si—O linkage and an Si—H linkage.

6. The process according to claim 1, wherein said interlayer dielectric comprises a first interlayer dielectric between wiring layers and a second interlayer dielectric between wirings, and said process further comprises the step of:

forming an intermediate layer made of a material which is different from the material for said first and second interlayer dielectrics after forming said first interlayer dielectric between wiring layers and before forming said second interlayer dielectric between wirings.

7. The process according to claim 6, wherein:

said interlayer dielectric between wiring layers is formed from an organic insulating material, said interlayer dielectric between wirings is formed from an organic insulating material, and said intermediate layer is formed from one of a silica film having an Si—O linkage, an Si—H linkage and an Si—CH$_x$ linkage wherein x represents 1, 2 or 3, and a silica film having an Si—O linkage and an Si—H linkage.

* * * * *